(12) United States Patent
Sun et al.

(10) Patent No.: US 10,636,656 B2
(45) Date of Patent: Apr. 28, 2020

(54) METHODS OF PROTECTING STRUCTURE OF INTEGRATED CIRCUIT FROM REWORK

(71) Applicant: GLOBALFOUNDRIES INC., Grand Cayman (KY)

(72) Inventors: Lei Sun, Altamont, NY (US); Xunyuan Zhang, Albany, NY (US); Frank W. Mont, Troy, NY (US); Shao Beng Law, Watervliet, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 66 days.

(21) Appl. No.: 15/954,066

(22) Filed: Apr. 16, 2018

(65) Prior Publication Data

US 2019/0318927 A1    Oct. 17, 2019

(51) Int. Cl.
*H01L 21/033*    (2006.01)
*H01L 21/768*    (2006.01)
*H01L 21/027*    (2006.01)
*H01L 21/02*     (2006.01)

(52) U.S. Cl.
CPC ...... *H01L 21/0332* (2013.01); *H01L 21/0273* (2013.01); *H01L 21/02164* (2013.01); *H01L 21/0338* (2013.01); *H01L 21/76816* (2013.01); *H01L 21/76843* (2013.01); *H01L 21/76879* (2013.01)

(58) Field of Classification Search
CPC .......... H01L 21/02164; H01L 21/0273; H01L 21/0332; H01L 21/0337; H01L 21/0338; H01L 21/76816; H01L 21/76843; H01L 21/76879
See application file for complete search history.

(56) References Cited

U.S. PATENT DOCUMENTS 6,524,912 B1 *  2/2003  Yang ................... H01L 21/7684
                                                       257/E21.019
2015/0228538 A1 *  8/2015  Wada ................ H01L 21/76879
                                                       257/774

* cited by examiner

*Primary Examiner* — Joseph M Galvin, III
(74) *Attorney, Agent, or Firm* — Anthony Canale; Hoffman Warnick LLC

(57) ABSTRACT

The present disclosure relates to methods of protecting a structure of an integrated circuit (IC) from rework, and more particularly, to methods of protecting a structure of an IC without impacting the critical dimension or the profile of the structure. For example, a method of protecting a structure of an IC from rework may include forming a first layer on a second layer; forming one or more first openings in the first layer, the first openings exposing a top surface of the second layer; selectively growing a Group VIII metal within the one or more first openings, thereby forming one or more first plugs; forming one or more final openings in the first layer; and removing the one or more first plugs.

20 Claims, 18 Drawing Sheets

METHODS OF PROTECTING STRUCTURE OF INTEGRATED CIRCUIT FROM REWORK

TECHNICAL FIELD

The subject matter disclosed herein relates generally to methods of protecting a structure of an integrated circuit (IC) from rework, and more particularly, to methods of protecting a structure of an IC without impacting the critical dimension (CD) or the profile of the structure.

BACKGROUND

Multiple patterning is a common patterning technique in the semiconductor chip manufacturing industry. Multiple patterning enables chipmakers to image integrated circuit (IC) designs at 20 nanometers (nm) and below. For 10 nm technology, double patterning is commonly used and typically refers to a litho-etch-litho-etch (LELE) pitch-splitting process or a spacer technique called self-aligned double patterning (SADP). However, in the case of 7 nm technology and below, patterning techniques other than extreme ultraviolet (EUV) lithography require triple or even quadruple patterning. These patterning processes can include litho-etch-litho-etch-litho-etch (LELELE) or self-aligned quadruple patterning (SAQP). During such multiple patterning techniques, patterns which are formed earlier are exposed to subsequent patterning steps, such as rework, which typically introduce changes in the critical dimension (CD) or profile of the earlier formed features.

BRIEF SUMMARY

Methods to perform rework on an integrated circuit without impacting critical dimension or the profile of certain features are disclosed. In a first aspect of the disclosure, a method of protecting an opening profile of an integrated circuit from rework includes: forming a first layer on a second layer, at least one of the first and second layers being a metal-containing layer; forming one or more first openings in the first layer, the one or more first openings defining the opening profile of the integrated circuit and exposing a top surface of the second layer; selectively growing a Group VIII metal within the one or more first openings, thereby forming one or more first plugs; forming one or more final openings in the first layer while the one or more first openings in the first layer are protected by the one or more first plugs; and removing the one or more first plugs. In this first aspect of the disclosure, the first layer can be a metal-containing layer and the growing of the Group VIII metal can comprise selectively growing the Group VIII metal on exposed sidewalls of the first openings of the metal-containing layer, or the second layer can be a metal-containing layer and the growing of the Group VIII metal can comprise selectively growing the Group VIII metal on the exposed top surface of the second layer within the first openings of the first layer method of protecting an opening profile of an integrated circuit from rework, the method comprising: forming a first layer on a second layer, at least one of the first and second layers being a metal-containing layer; forming one or more first openings in the first layer, the one or more first openings defining the opening profile of the integrated circuit and exposing a top surface of the second layer; selectively growing a Group VIII metal within the one or more first openings, thereby forming one or more first plugs; forming one or more final openings in the first layer while the one or more first openings in the first layer are protected by the one or more first plugs; and removing the one or more first plugs.

In a second aspect of the disclosure, a method of protecting an opening profile of an integrated circuit from rework includes: forming a first layer on a second layer, the first or second layer being a titanium nitride (TiN) layer; forming an over-layer stack on the first layer, the over-layer stack comprising a resist layer having one or more resist openings; forming one or more first openings through the first layer at the one or more resist openings, the one or more first openings defining the opening profile of the integrated circuit, and exposing the top surface of the second layer; removing at least a portion of the over-layer stack; selectively growing cobalt (Co) or ruthenium (Ru) within the one or more first openings, thereby forming one or more first plugs; removing any remaining portion of the over-layer stack; forming one or more final openings in the first layer in the first layer while the one or more first openings in the first layer are protected by the one or more first plugs; and removing the one or more first plugs.

BRIEF DESCRIPTION OF THE DRAWINGS

These and other features of this disclosure will be more readily understood from the following detailed description of the various aspects of the disclosure taken in conjunction with the accompanying figures that depict various embodiments of the disclosure.

It is noted that the figures of the disclosure are not necessarily to scale. The figures are intended to depict only typical aspects of the disclosure, and therefore should not be considered as limiting the scope of the disclosure. In the figures, like numbering represents like elements between the figures.

DETAILED DESCRIPTION

Detailed embodiments of the claimed methods are disclosed herein; however, it can be understood that the disclosed embodiments are merely illustrative of the claimed methods that may be embodied in various forms. The subject matter of this disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art.

In the interest of not obscuring the presentation of embodiments of the present disclosure, in the following detailed description, some processing steps or operations that are known in the art may have been combined together for presentation and for illustration purposes and, in some instances, may have not been described in detail. In other instances, some processing steps or operations that are known in the art may not be described at all. It should be understood that the following description is rather focused on the distinctive features or elements of various embodiments of the present disclosure.

The present disclosure relates generally to methods of protecting a structure of an integrated circuit (IC) from rework, and more particularly, to methods of protecting a structure of an IC without impacting the critical dimension (CD) or the profile of the structure. As mentioned above, during conventional multiple patterning techniques, patterns which are formed earlier are exposed to subsequent patterning steps, such as rework, and this typically introduces changes in the CD or profile of the earlier formed features/structures. Methods of protecting a structure of an IC from rework's impact on the CD or profile of the structure are described below and with reference to the Figures.

A first embodiment of the first aspect of the disclosure is drawn toward via patterning and is described below with respect to FIG. 1 through FIG. 10.

Figure 1:
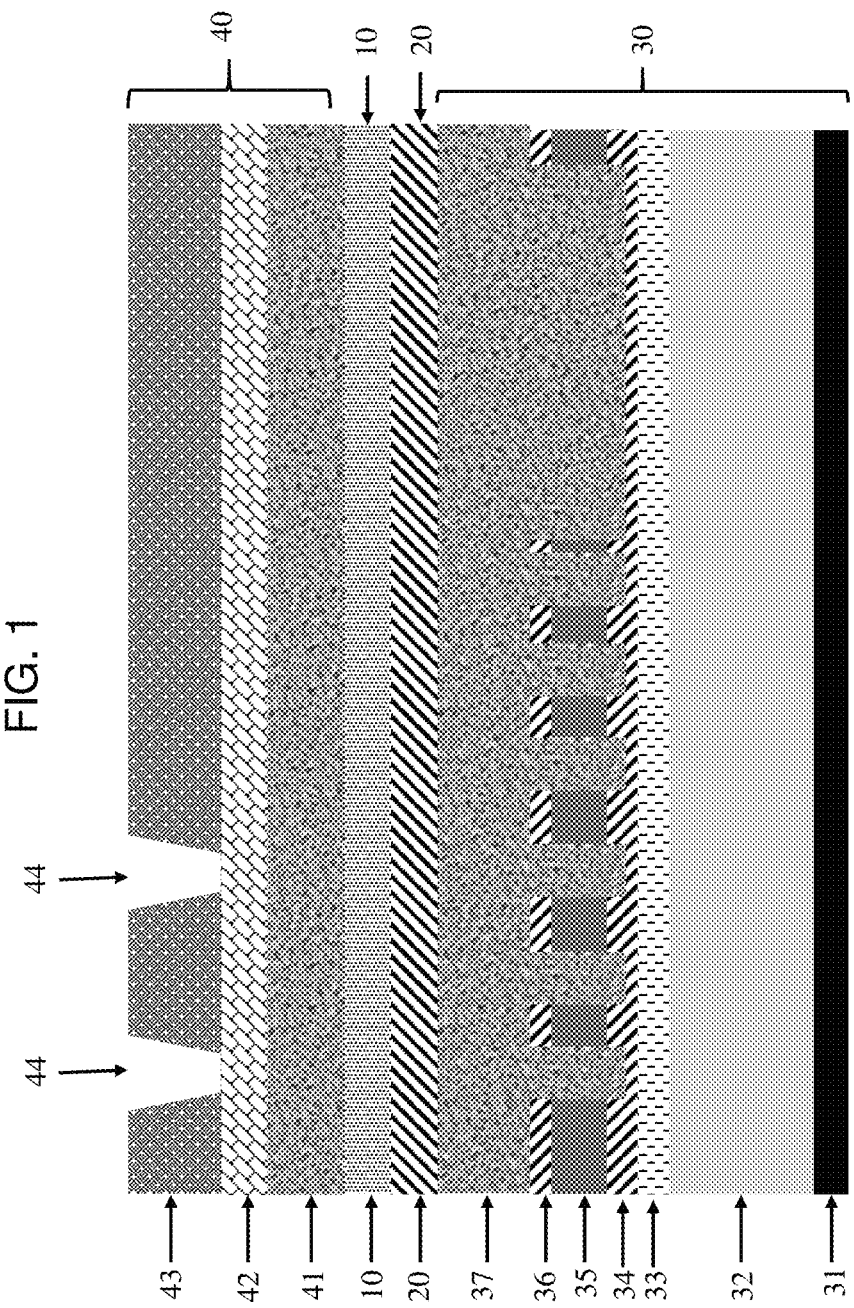
FIG. 1 shows a cross-sectional view of a multiple layer formation of a portion of an IC to have via openings patterned therein.

FIG. 1 illustrates a multiple stack layer configuration that is to be the subject of via patterning. From the top down, the multiple stack layer configuration includes an over-layer stack 40, a first metal-containing layer 10, a second layer 20, and an under-layer stack 30. First metal-containing layer 10 can contain any metal, for example, titanium. First metal-containing layer 10 can be, for instance, titanium nitride (TiN). First metal-containing layer 10 can have a thickness in the range of about 5 nanometers to about 50 nanometers, for instance 20 nanometers. Second layer 20 can be, for example, a low-temperature oxide (LTO) layer. Second layer 20 can have a thickness in the range of about 5 nanometers to about 50 nanometers, for instance, 30 nanometers. Under-layer stack 30 and over-layer stack 40 can have any number of layers varying from one layer to two, three, four, five, etc. layers. Both of stacks 30 and 40 do not need to be present. Layers and/or materials below the configuration depicted in FIG. 1 (not shown) are those such as, for example, a semiconductor substrate including for instance a semiconductor material, front end of the line features such as transistors, and back end of the line wiring layers.

ICs are composed of many overlapping layers. For instance, some layers of an IC include where various dopants are diffused into a substrate (typically called diffusion layers), some define where additional ions are implanted (typically called implant layers), some define the conductors (for example, polysilicon or metal layers), and some define the connections between the conducting layers (for example, via or contact layers). Each IC is constructed from a specific combination of these types of layers and more. Under-layer stack 30 of the disclosure can represent any combinations of layers typical for an IC. Stacks 30 and 40 of the disclosure may be formed by any conventional stack (multiple layer) formation method, for example deposition. "Deposition" or "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

In the instance of FIG. 1, under-layer stack 30 is shown as including a combination of seven layers, i.e., layers 31 through 37. The number of layers in stack 30 is not critical and, as stated above, may vary from one layer to two, three, four, five, etc. layers. The seven layers of under-layer stack 30 can include, for example, a nitrogen-doped silicon carbide layer 31, an octamethyl cyclotetrasiloxane (OMCTS) layer 32, an OMCTS hardmask (OMCTS-HM) layer 33, a lower tetraethyl orthosilicate (TEOS) layer 34, a second metal-containing layer 35, an upper TEOS layer 36, and an organic planarization layer (OPL) 37. These are just examples of some types of layers that can be included in under-layer stack 30. Any conventional layers for an under-layer stack can be used. Second metal-containing layer 35 may be the same as or different than first metal-containing layer 10, i.e., in terms of dielectric material used. Second metal-containing layer 35 can contain any metal, for example, titanium. Second metal-containing layer 35 can be, for instance, titanium nitride (TiN).

As also depicted in FIG. 1, second metal-containing layer 35 and upper and lower TEOS layers 34, 36 have a pattern therein which is filled by the layer above TEOS layer 36, namely organic planarization layer (OPL) layer 37. OPL 37 can have a thickness in the range of about 50 nanometers to about 400 nanometers. It is noted here that conventional multiple patterning techniques do not typically utilize a combination of first metal-containing layer 10 over second layer 20 (LTO) which is over OPL 37.

Also in the instance of FIG. 1, a first over-layer stack 40 is shown as including three layers, namely a silicon-containing anti-reflective coating (SiARC) layer 42 over an OPL 41 and a resist layer 43 over SiARC layer 42. SiARC layer 42 can have a thickness in the range of about 5 nanometers to about 30 nanometers, for instance, 20 nanometers. OPL 41 can be the same as or different from OPL 37 of under-layer stack 30. OPL 41 can have a thickness in the range of about 50 nanometers to about 400 nanometers, for instance 200 nanometers. Resist layer 43 can have a thickness in the range of about 20 nanometers to about 100 nanometers, for instance, 50 nanometers.

The summation of stacked layers in FIG. 1 is an example configuration that can be the subject of multiple patterning, for instance via patterning. Before the via patterning method of the disclosure begins, one or more resist openings 44 are formed in resist layer 43.

Figure 2:
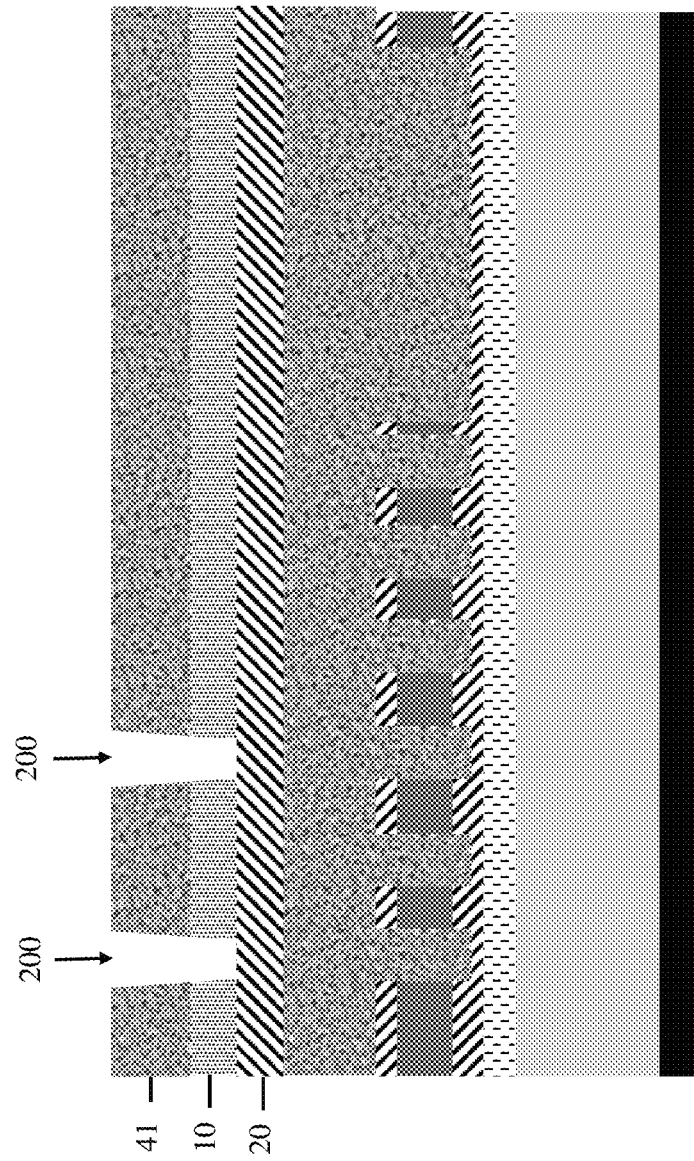
FIG. 2 shows a cross-sectional view of formation of first via openings through an over-layer stack and into a first (metal-containing) layer.

FIG. 2 illustrates: (i) formation of one or more first via openings 200 at resist openings 44 and through first over-layer stack 40 (FIG. 1) and first metal-containing layer 10, stopping at second layer 20, and (ii) removal of the top two layers of stack 40, namely SiARC 42 and resist 43 (FIG. 1). As shown in FIG. 2, bottom-most layer OPL 41 of stack 40 remains on top of first metal-containing layer 10 such that the only exposed surfaces of first metal-containing layer 10 are vertical/near-vertical surfaces within via openings 200. Via openings 200 can be formed by any now known or later developed via formation technique including, but not limited to, etching, and define an opening profile for the IC.

Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. In one example, RIE may be employed for FIG. 2.

Figure 3:
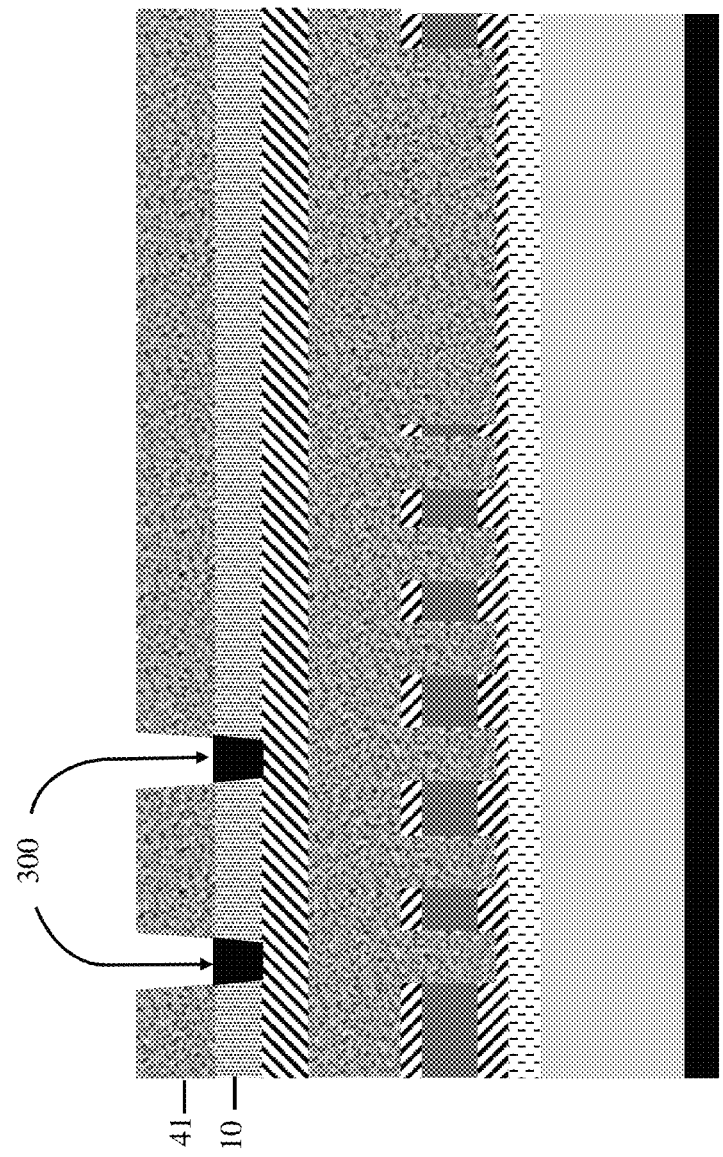
FIG. 3 shows a cross-sectional view of selective growth of a Group VIII metal on exposed surfaces of the first (metal-containing) layer to form first plugs.

FIG. 3 illustrates formation of first plugs 300 within first via openings 200. First plugs 300 are formed by selective growth of a Group VIII metal on the above-noted exposed vertical/near-vertical surfaces of metal-containing layer 10 within via openings 200 (FIG. 2). Group VIII metals include iron, cobalt, nickel, ruthenium, rhodium, palladium, osmium, iridium, platinum, hassium, meitnerium and darmstadtium. The Group VIII metal of first plugs 300 may be any Group VIII metal such as, for example, cobalt (Co) or ruthenium (Ru). The selective growth of the Group VIII metal can be, for example, via deposition, for instance ALD. The growth of the Group VIII metal includes a lateral growth from the exposed surfaces of metal-containing layer 10 (i.e., from exposed sidewalls of openings 200 in layer 10). The lateral growth from adjacent exposed vertical surfaces (sidewalls) within a given via opening 200 ultimately joins together to form one cohesive plug 300 per via opening 200 (FIG. 2). In other words, the Group VIII metal grows from a left vertical face (sidewall) toward a right vertical face (sidewall) and also grows from a right vertical face (sidewall) toward a left vertical face (sidewall), meeting in the middle to form one cohesive plug. Two plugs 300 are depicted in FIG. 3, however this number may vary depending on how many vias are desired.

Figure 4:
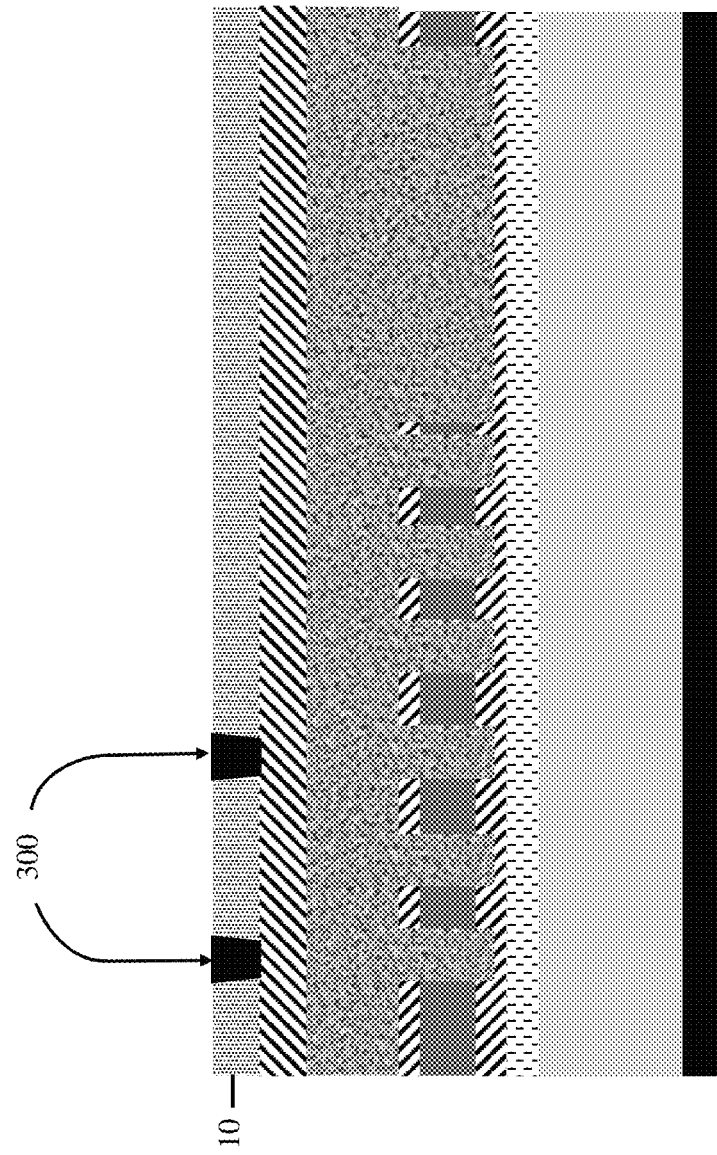
FIG. 4 shows a cross-sectional view of above-plug layer stripping.

FIG. 4 illustrates removal of the bottom-most layer of over-layer stack 40, namely OPL 41 (FIG. 3). Any now known or later developed removal technique can be used so long as it is selective to the layer being removed and does not harm or alter metal-containing layer 10 and plugs 300.

FIG. 5 through FIG. 8 show a second via patterning on the same multiple stack layer configuration that the first via openings were formed in. The steps of FIG. 5 through FIG. 8 parallel those of FIG. 1 through FIG. 4, respectively. As will become evident, first plugs 300 in first via openings 200 will protect the CD and profile of via openings 200 during formation of additional via openings in the situation that additional via openings need to be reworked.

Figure 5:
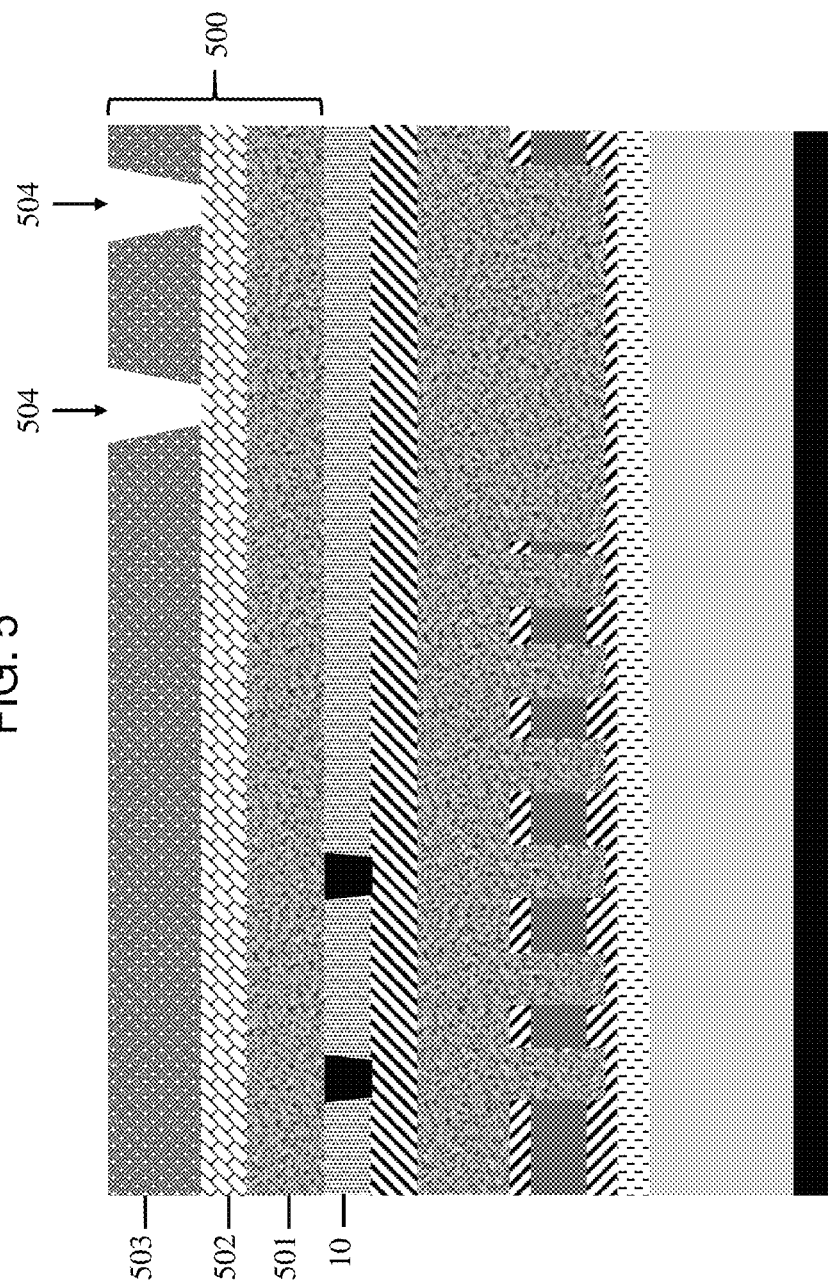
FIG. 5 shows a cross-sectional view of formation of a second over-layer stack on the plug-containing layer.

FIG. 5 illustrates formation of a second over-layer stack 500 on first metal-containing layer 10 and a top surface of first plugs 300. Second overl-layer stack 500 is shown as including three layers, namely a silicon-containing anti-reflective coating (SiARC) layer 502 over an OPL 501 and a resist layer 503 over SiARC layer 502. Similar to FIG. 1, one or more second resist openings 504 are formed in resist layer 503.

Figure 6:
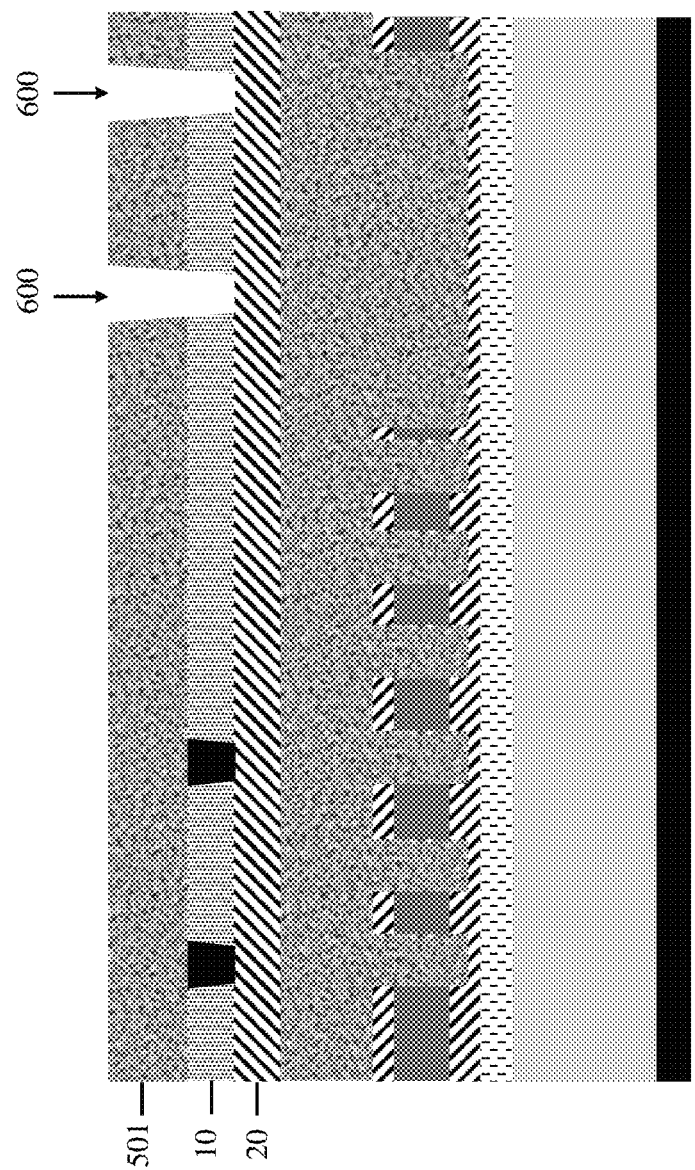
FIG. 6 shows a cross-sectional view of formation of second via openings through the second over-layer stack and into the first (metal-containing) layer.

FIG. 6 illustrates: (i) formation of second via openings 600 at resist openings 504 and through second over-layer stack 500 (FIG. 5) and first metal-containing layer 10, stopping at second layer 20, and (ii) removal of the top two layers of stack 500, namely SiARC 502 and resist 503 (FIG. 5). Similar to FIG. 2, bottom-most layer OPL 501 of over-layer stack 500 remains on top of first metal-containing layer 10 such that the only exposed surfaces of first metal-containing layer 10 are vertical/near-vertical surfaces (sidewalls) within via openings 600. Via openings 600 can be formed by any now known or later developed via formation technique including, but not limited to, etching. Second via openings 600 can be formed by the same or different technique as that of first via openings 200, and can add to the opening profile of the IC.

Figure 7:
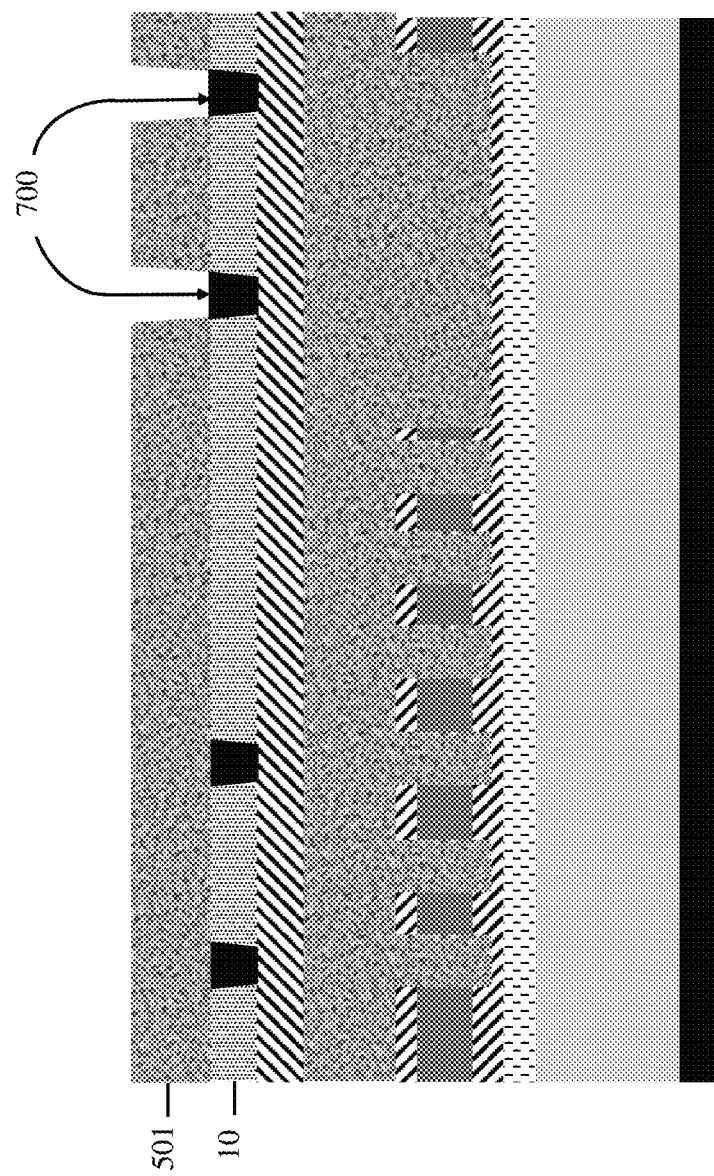
FIG. 7 shows a cross-sectional view of formation of second plugs.

FIG. 7 illustrates formation of second plugs 700 within second via openings 600 (FIG. 6). Second plugs 700 are formed by selective growth of a Group VIII metal on the exposed vertical/near-vertical surfaces of first metal-containing layer 10 within via openings 600 (FIG. 6). Same as for first plugs 300, the growth of the Group VIII metal is a lateral growth from the exposed surfaces of metal-containing layer 10. The lateral growth from adjacent exposed vertical surfaces (sidewalls) within a given via opening 600 ultimately joins together to form one cohesive plug 700 per via opening 600. Two plugs 700 are depicted in FIG. 7, however this number may vary depending on how many vias are desired.

Figure 8:
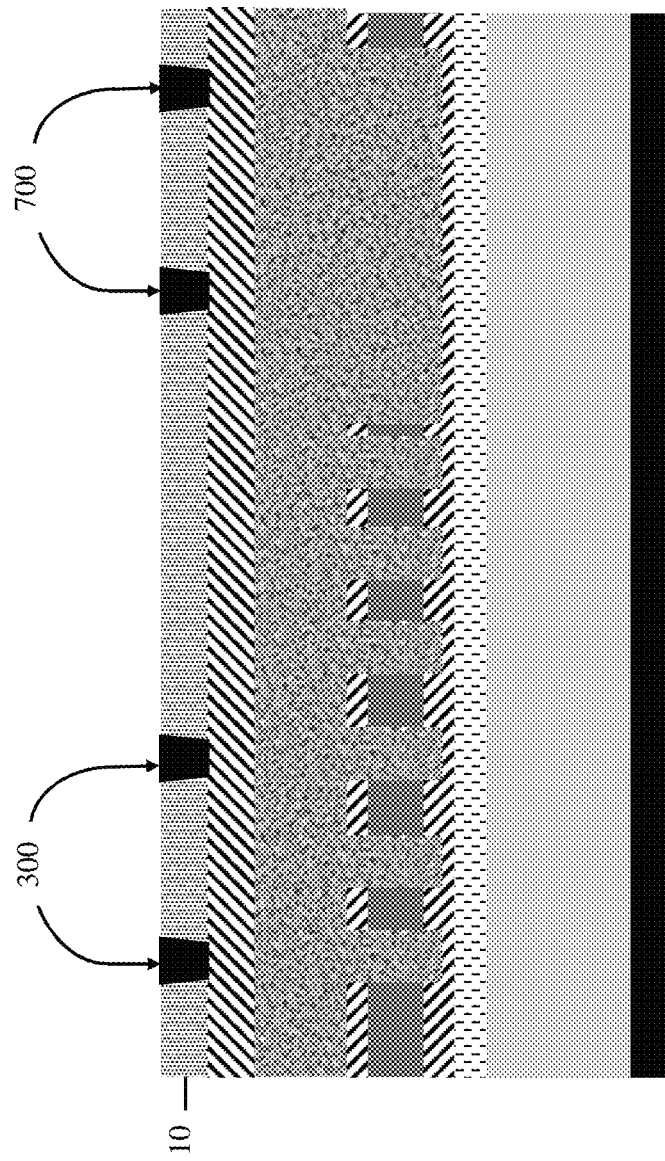
FIG. 8 shows a cross-sectional view of above-plug layer stripping.

FIG. 8 depicts the result of removal of the bottom-most layer of over-layer stack 500, namely OPL 501, as shown in FIG. 7. Any now known or later developed removal technique can be used so long as it is selective to the layer being removed and does not harm or alter first metal-containing layer 10 and plugs 300, 700.

Figure 9:
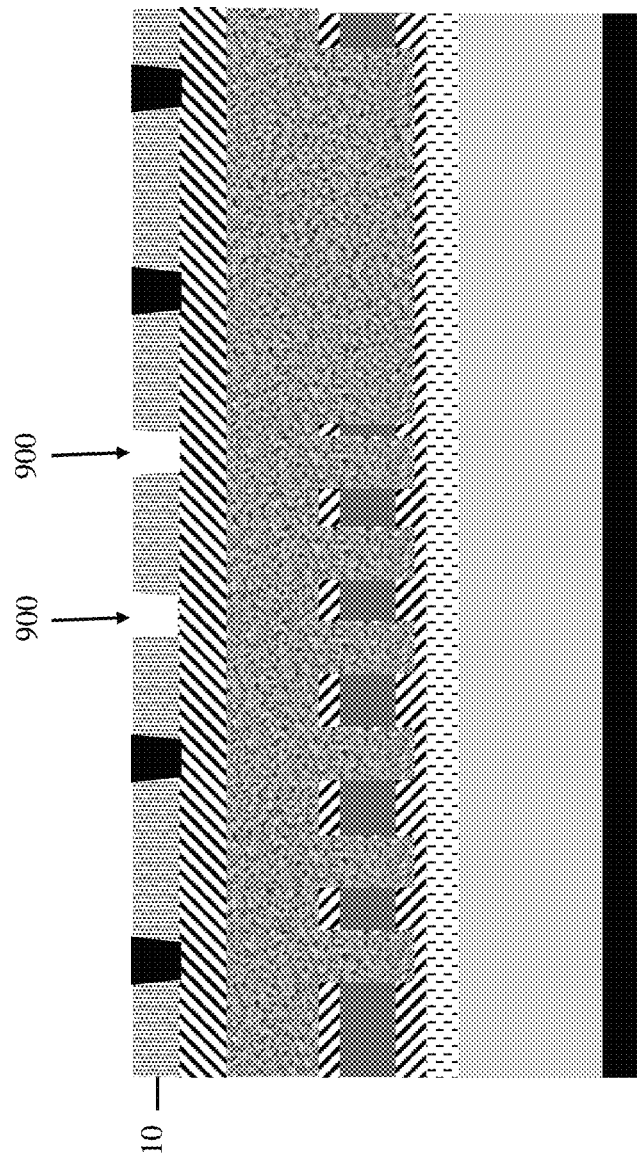
FIG. 9 shows a cross-sectional view of formation of final via openings in the first (metal-containing) layer.
Figure 10:
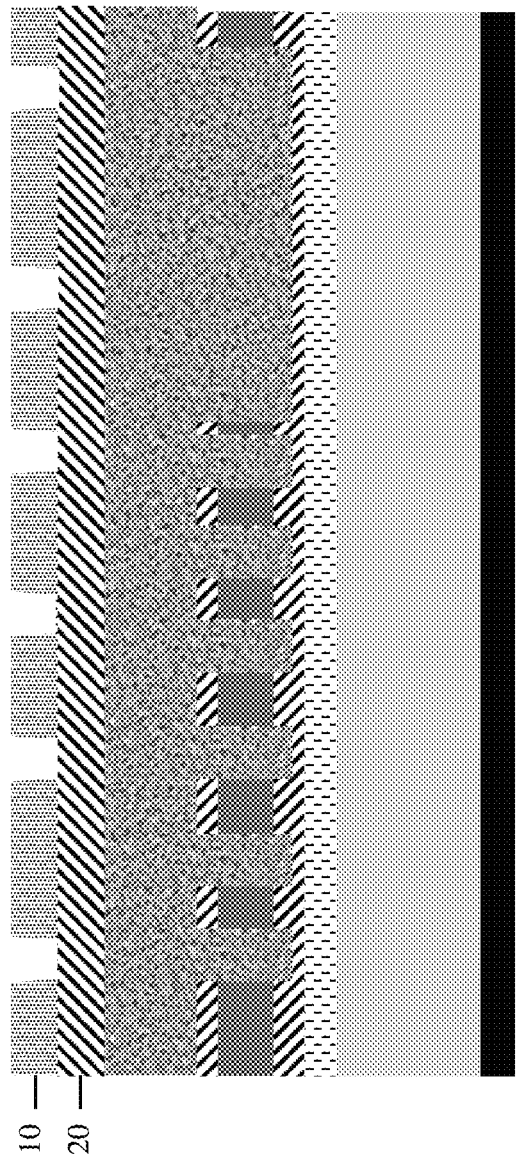
FIG. 10 shows a cross-sectional view of removal of all plugs.

FIG. 9 and FIG. 10 show a final (third) via patterning on the same multiple stack layer configuration that the first and second via openings were formed in. As will become evident, first plugs 300 and second plugs 700 (FIG. 8) in first and second via openings 200 and 600, respectively (FIG. 2, FIG. 6), will protect the CD and profile of via openings 200, 600 (FIG. 2, FIG. 6) during formation of the final (third) via openings in the situation that the final (third) via openings need to be reworked.

FIG. 9 illustrates formation of final (third) via openings 900 in first metal-containing layer 10. Via openings 900 can be formed by any now known or later developed via formation technique including, but not limited to, etching. Final (third) via openings 900 can be formed by the same or different technique as that of first via openings 200 and/or second via openings 600. Since via openings 900 are the final via openings being patterned in this example, there is no need for plug formation within via openings 900.

FIG. 10 illustrates removal of all plugs, namely first plugs 300 and second plugs 700. Such removal of the Group VIII metal that the plugs are made of can be performed with deionized water, thus it is safe and does not impact first metal-containing layer 10 and second layer 20.

The method as depicted in FIG. 1 through FIG. 10 results in multiple via patterning wherein the CD and profile of prior formed via openings are unchanged by the subsequent forming of additional via openings, i.e., the opening profile of the IC is protected. For example, the CD and profile of first via openings 200 are unchanged by the forming of second via openings 600 and third/final via openings 900, and second via openings 600 are unchanged by the forming of third/final via openings 900. Consequently, vias formed in via openings have their CD and profile protected resulting in improved CD and profile uniformity amongst the vias. This improved uniformity minimizes the impact of rework on yield, for example, it minimizes degraded product yield quality due to rework.

The summation of FIG. 1 through FIG. 10 illustrates a LELELE process (triple patterning); however, the method of the disclosure can be equally applied to doubling patterning (e.g., LELE) or quadruple patterning and beyond. Regardless of the degree of multiple patterning (e.g., double, triple, quadruple, etc.), the negative impact that rework can have on product yield quality can be minimized.

A second embodiment of the first aspect of the disclosure is drawn toward line patterning and is described below with respect to FIG. 11 through FIG. 18.

Figure 11:
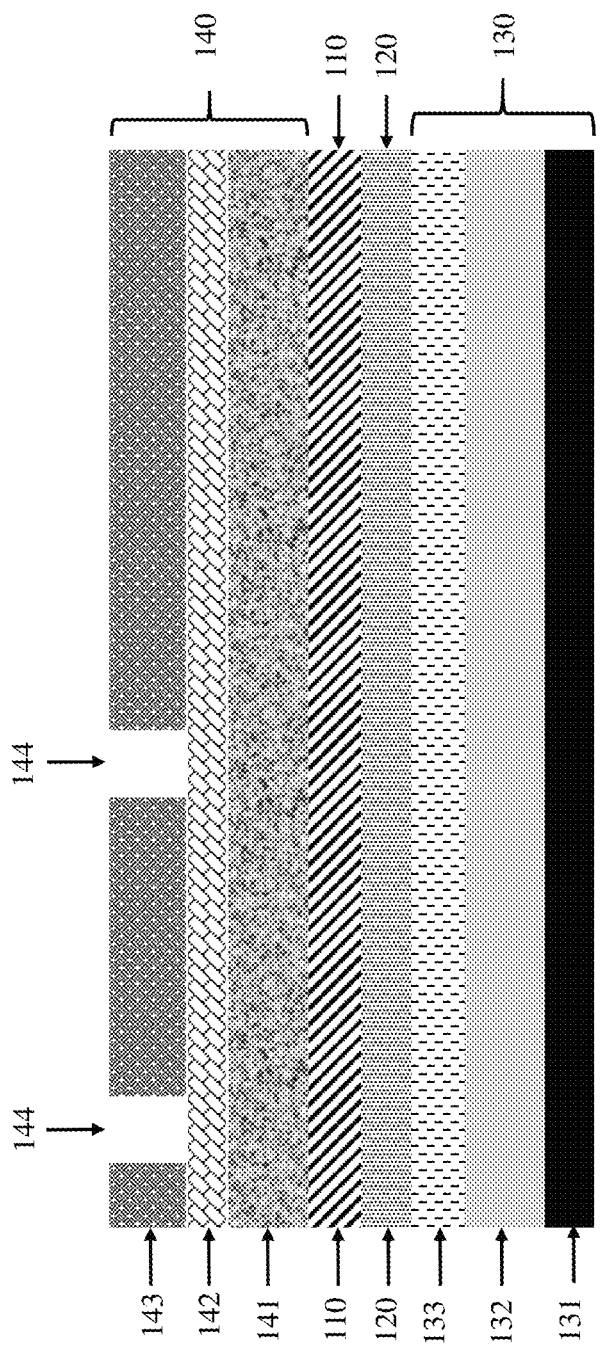
FIG. 11 shows a cross-sectional view of the multiple layer formation of a portion of an IC to have line trenches patterned therein.

FIG. 11 illustrates a multiple stack layer configuration that is to be the subject of line patterning. The multiple stack layer configuration includes a first layer 110 on a second (metal-containing) layer 120, second (metal-containing) layer having an under-layer stack 130 thereunder, and first layer 110 having an over-layer stack 140 thereover. Second metal-containing layer 120 can contain any metal, for example, titanium. Second metal-containing layer 120 can be, for instance, titanium nitride (TiN). Second metal-containing layer 120 can have a thickness in the range of about 5 nanometers to about 50 nanometers, for instance 20 nanometers. First layer 110 can be, for example, a silicon dioxide (SiO$_2$) precursor layer which in turn can be, for example, TEOS. First layer 110 can have a thickness in the range of about 5 nanometers to about 50 nanometers, for instance 20 nanometers. The number of layers in under-layer stack 130 and over-layer stack 140 is not critical and may vary from one layer to two, three, four, five, etc. layers. Layers and/or materials below the configuration depicted in FIG. 11 (not shown) are those such as, for example, a semiconductor substrate including for instance a semiconductor material, front end of the line features such as transistors, and back end of the line wiring layers.

In the instance of FIG. 11, under-layer stack 130 is shown as including three layers, namely an octamethyl cyclotetrasiloxane (OMCTS) layer 132 over a nitrogen-doped silicon carbide layer 131, and an OMCTS hardmask (OMCTS-HM) layer 133 over OMCTS layer 132. These are just examples of some types of layers that can be included in under-layer stack 130. Any conventional layers for an under-layer stack can be used.

Also in the instance of FIG. 11 and similar to FIG. 1, a first over-layer stack 140 is shown as including three layers, namely a Si-containing anti-reflective coating (SiARC) layer 142 over an OPL 141 and a resist layer 143 over SiARC layer 142. SiARC layer 142 can have a thickness in the range of about 5 nanometers to about 30 nanometers, for instance, 20 nanometers. OPL 141 can have a thickness in the range of about 50 nanometers to about 400 nanometers, for instance 200 nanometers. Resist layer 143 can have a thickness in the range of about 20 nanometers to about 100 nanometers, for instance, 50 nanometers.

The summation of stacked layers in FIG. 11 is an example configuration that can be the subject of multiple patterning, for instance, line patterning. Before the line patterning method of the disclosure begins, one or more resist openings 144 are formed in resist layer 143.

Figure 12:
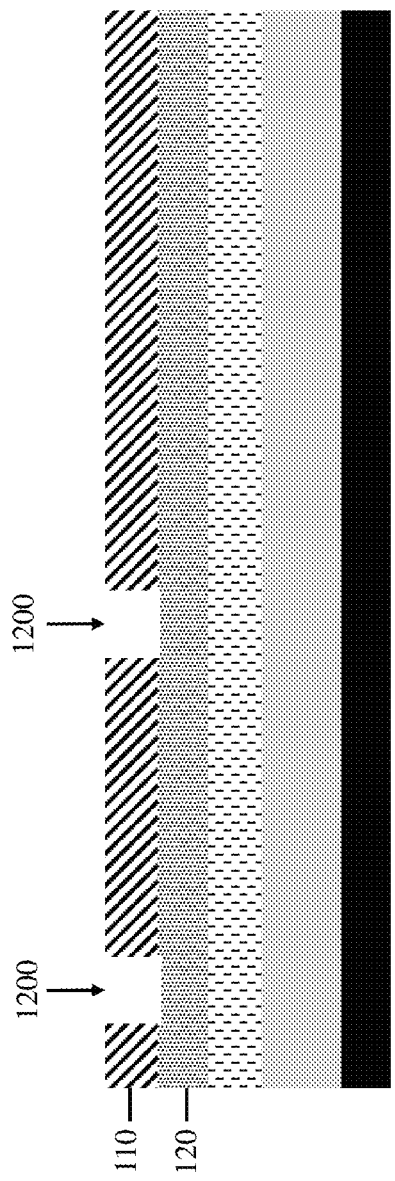
FIG. 12 shows a cross-sectional view of formation of first line trenches into a first (silicon dioxide precursor) layer and exposure of a top surface of a second (metal-containing) layer.

FIG. 12 illustrates: (i) formation of one or more first line trenches 1200 at resist openings 144 and through over-layer stack 140 and first layer 110 (FIG. 11), stopping at second metal-containing layer 120, and (ii) removal of over-layer stack 140 (FIG. 11). As shown in FIG. 12, the only exposed surfaces of second metal-containing layer 120 are a top surface of second metal-containing layer 120 within each line trench 1200. Line trenches 1200 can be formed by any now known or later developed line trench formation technique including, but not limited to, etching, and define an opening profile for the IC.

Figure 13:
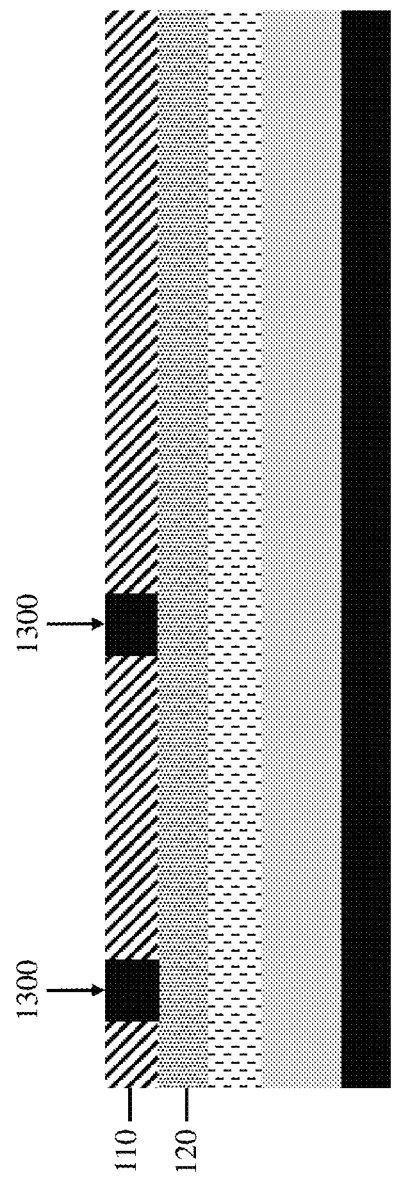
FIG. 13 shows a cross-sectional view of selective growth of a Group VIII metal on exposed surfaces of the second (metal-containing) layer to form first plugs.

FIG. 13 illustrates formation of first plugs 1300 within first line trenches 1200 (FIG. 12). First plugs 1300 are formed by selective growth of a Group VIII metal on the above-noted exposed top surfaces of second metal-containing layer 120 within line trenches 1200 (FIG. 12). Group VIII metals are described above with respect to the first embodiment of this aspect of the disclosure. The Group VIII metal of first plugs 1300 may be any Group VIII metal such as, for example, Co or Ru. The selective growth of the Group VIII metal can be for example, via deposition, for instance ALD. The growth of the Group VIII metal includes an upward growth from the exposed top surfaces of second metal-containing layer 120. The upward growth continues for the thickness of first layer 110 and forms one plug 1300 per line trench 1200. Two plugs 1300 are depicted in FIG. 13, however this number may vary depending on how many lines are desired.

Figure 14:
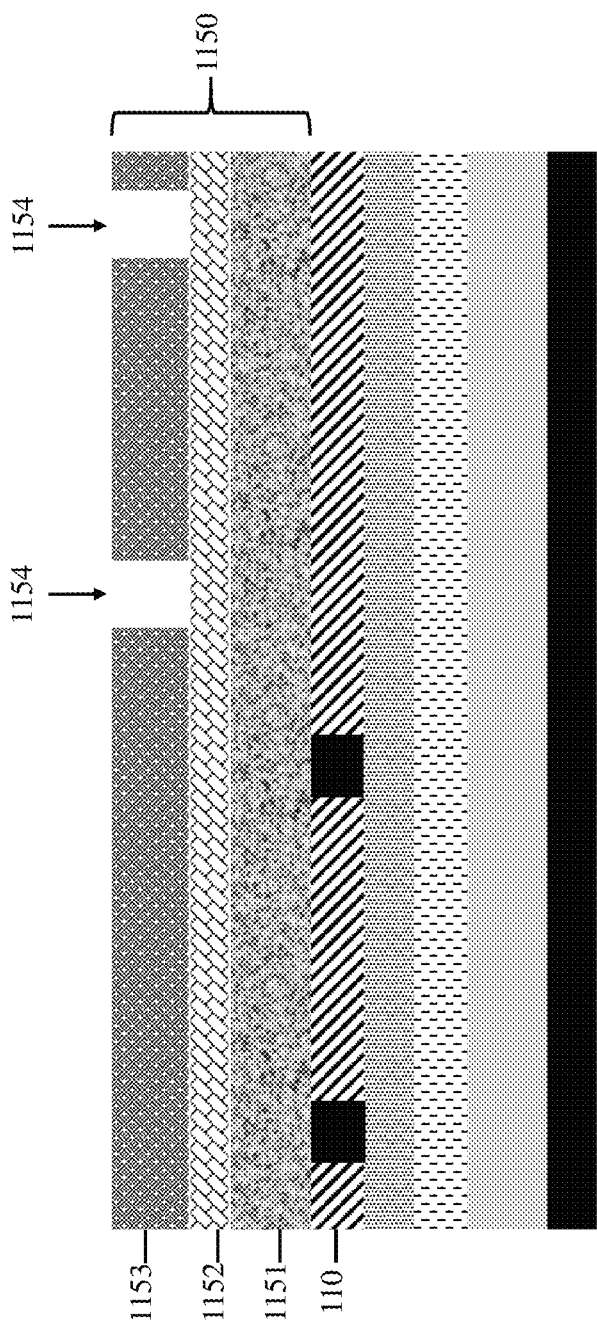
FIG. 14 shows a cross-sectional view of formation of a second over-layer stack on the plug-containing layer.
Figure 15:
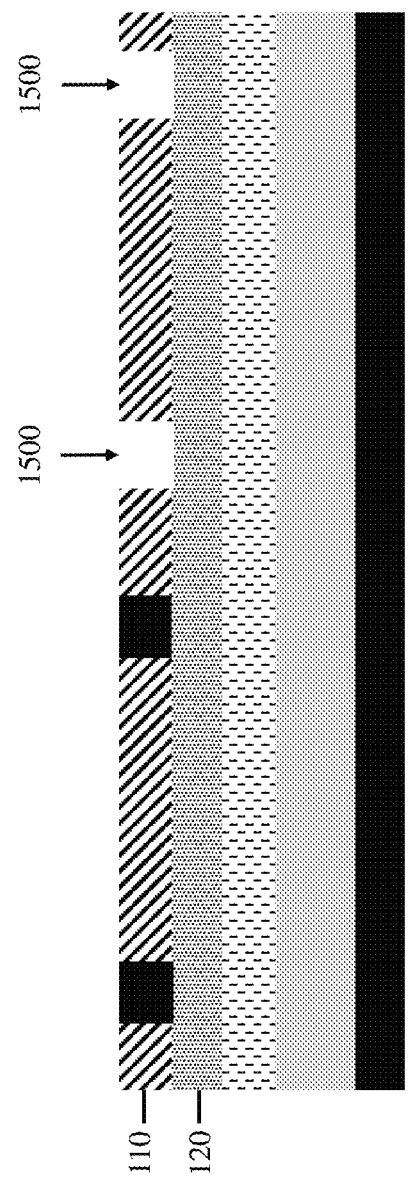
FIG. 15 shows a cross-sectional view of formation of second line trenches into the first (silicon dioxide precursor) layer and exposure of the top surface of the second (metal-containing) layer.
Figure 16:
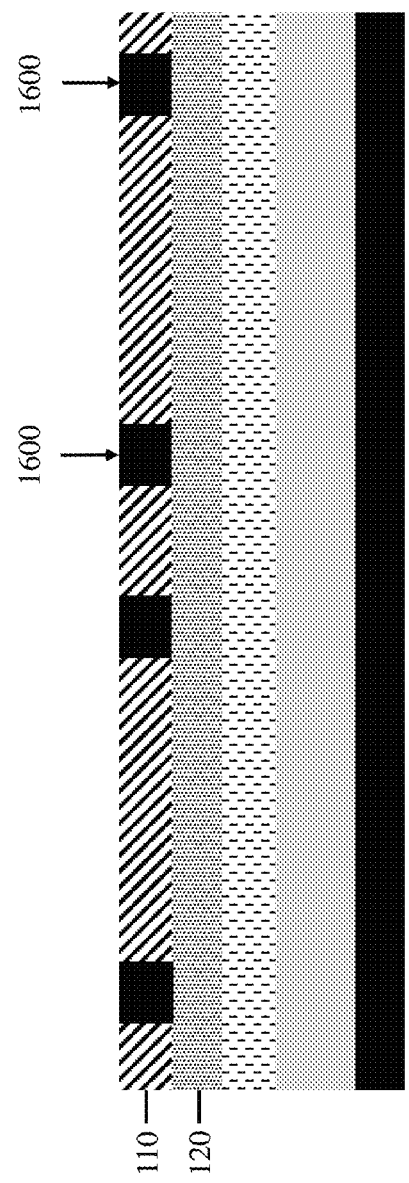
FIG. 16 shows a cross-sectional view of selective growth of the Group VIII metal on exposed surfaces of the second (metal-containing) layer to form second o plugs.

FIG. 14 through FIG. 16 show a second line patterning on the same multiple stack layer configuration that the first line trenches were formed in. The steps of FIG. 14 through FIG. 16 parallel those of FIG. 11 through FIG. 13, respectively. As will become evident, first plugs 1300 in first line trenches 1200 will protect the CD and profile of line trenches 1200 during formation of additional line trenches in the situation that additional line trenches need to be reworked.

FIG. 14 illustrates formation of a second over-layer stack 1150 on first layer 110 and a top surface of first plugs 1300 (FIG. 13). Second over-layer stack 1150 is shown as including three layers, namely a Si-containing anti-reflective coating (SiARC) layer 1152 over an OPL 1151 and a resist layer 1153 over SiARC layer 1152. Similar to FIG. 11, one or more second resist openings 1154 are formed in resist layer 1153.

FIG. 15 illustrates: (i) formation of one or more second line trenches 1500 at resist openings 1154 and through over-layer stack 1150 and first layer 110 (FIG. 14), stopping at second metal-containing layer 120, and (ii) removal of over-layer stack 1150 (FIG. 14). As shown in FIG. 15, the only exposed surfaces of second metal-containing layer 120 are a top surface of second metal-containing layer 120 within each line trench 1500. Line trenches 1500 can be formed by any now known or later developed line trench formation technique including, but not limited to, etching. Line trenches 1500 can be formed by the same or different technique as that of line trenches 1200, and add to the opening profile of the IC.

FIG. 16 illustrates formation of second plugs 1600 within second line trenches 1500 (FIG. 15). Second plugs 1600 are formed by selective growth of a Group VIII metal on the exposed top surfaces of second metal-containing layer 120 within second line trenches 1500. Same as for first plugs 1300, the growth of the Group VIII metal is an upward growth from the exposed top surfaces of second metal-containing layer 120. The upward growth continues for the thickness of first layer 110 and forms one plug 1600 per line 1500 (FIG. 15). Two plugs 1600 are depicted in FIG. 16, however this number may vary depending on how many lines are desired.

Figure 17:
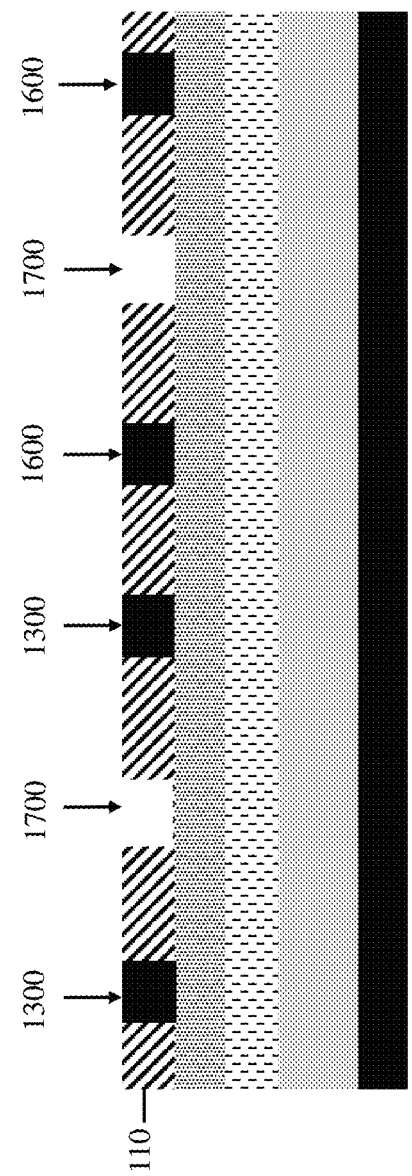
FIG. 17 shows a cross-sectional view of formation of final line trenches in the first (silicon dioxide precursor) layer.
Figure 18:
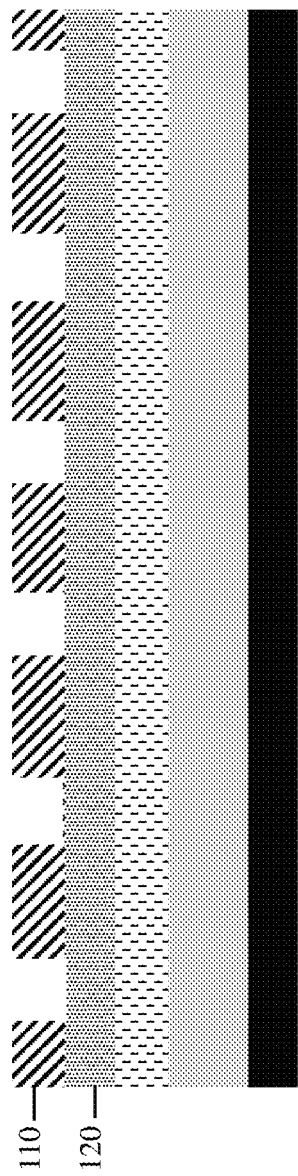
FIG. 18 shows a cross-sectional view of removal of all plugs.

FIG. 17 and FIG. 18 show a final (third) line patterning on the same multiple stack layer configuration that the first and second line trenches were formed in. As will become evident, first plugs 1300 and second plugs 1600 in first and second line trenches 1200 and 1500, respectively (FIG. 12, FIG. 15), will protect the CD and profile of line trenches 1200, 1500 (FIG. 12, FIG. 15) during formation of the final (third) line trenches in the situation that the final (third) line trenches need to be reworked.

FIG. 17 illustrates formation of final (third) line trenches 1700 in first layer 110. Line trenches 1700 can be formed by any now known or later developed line trench formation technique including, but not limited to, etching. Final (third) line trenches 1700 can be formed by the same or different technique as that of first line trenches 1200 and/or second line trenches 1500. Since line trenches 1700 are the final line trenches being patterned in this example, there is no need for plug formation within line trenches 1700.

FIG. 18 illustrates removal of all plugs, namely first plugs 1300 and second plugs 1600. Such removal of the Group VIII metal that the plugs are made of can be performed with deionized water, thus it is safe and does not impact first layer 110 and second metal-containing layer 120.

The method as depicted in FIG. 11 through FIG. 18 results in multiple line patterning wherein the CD and profile of prior formed line trenches are unchanged by the subsequent forming of additional line trenches. For example, the CD and profile of first line trenches 1200 are unchanged by the forming of second line trenches 1500 and third/final line trenches 1700, and second line trenches 1500 are unchanged by the forming of third/final line trenches 1700. Consequently, lines formed in line trenches have their CD and profile protected, resulting in improved CD and profile uniformity amongst the lines. This improved uniformity minimizes the impact of rework on yield, for example, it minimizes degraded product yield quality due to rework.

The summation of FIG. 11 through FIG. 18 illustrates a LELELE process (triple patterning); however, the method of the disclosure can be equally applied to doubling patterning (e.g., LELE) or quadruple patterning and beyond. Regardless of the degree of multiple patterning (e.g., double, triple, quadruple, etc.), the negative impact that rework can have on product yield quality can be minimized.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" or "about" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. A method of protecting an opening profile of an integrated circuit from rework, the method comprising:

forming a first layer on a second layer, at least one of the first and second layers being a metal-containing layer;

forming one or more first openings in the first layer, the one or more first openings defining the opening profile of the integrated circuit and exposing a top surface of the second layer;

selectively growing a Group VIII metal within the one or more first openings, thereby forming one or more first plugs;

forming one or more final openings in the first layer while the one or more first openings in the first layer are protected by the one or more first plugs; and removing the one or more first plugs.

2. The method of claim 1, wherein the first layer is the metal-containing layer and the growing of the Group VIII metal comprises selectively growing the Group VIII metal on exposed sidewalls of the first openings of the metal-containing layer.

3. The method of claim 2, wherein the metal-containing layer is a titanium nitride (TiN) layer.

4. The method of claim 2, wherein the Group VIII metal is cobalt (Co) or ruthenium (Ru).

5. The method of claim 2, wherein the second layer is a low-temperature oxide (LTO) layer.

6. The method of claim 2, wherein a profile of the one or more first openings is unchanged by the forming of the one or more final openings.

7. The method of claim 2, further comprising, after the forming of the first plugs and before the forming of the final openings:
    forming one or more second openings in the first layer, the second openings exposing the top surface of the second layer and further defining the opening profile, the one or more first openings in the first layer and the opening profile being protected by the one or more first plugs; and
    selectively growing the Group VIII metal on exposed sidewalls of the second openings of the metal-containing layer, thereby forming one or more second plugs,
    wherein the removing the one or more first plugs also includes removing the one or more second plugs.

8. The method of claim 7, wherein the first and second openings are via openings and the forming of the first and second via openings comprises:
    forming an over-layer stack on the first layer, the over-layer stack comprising a resist layer having one or more resist openings;
    forming via openings through the first layer at the one or more resist openings such that the top surface of the second layer is exposed; and
    removing the over-layer stack.

9. The method of claim 7, wherein a profile of the one or more first openings is unchanged by the forming of the one or more second openings and the one or more final openings, and a profile of the one or more second openings is unchanged by the forming of the one or more final openings.

10. The method of claim 1, wherein the second layer is the metal-containing layer and the growing of the Group VIII metal comprises selectively growing the Group VIII metal on the exposed top surface of the second layer within the first openings of the first layer.

11. The method of claim 10, wherein the metal-containing layer is a titanium nitride (TiN) layer.

12. The method of claim 10, wherein the Group VIII metal is cobalt (Co) or ruthenium (Ru).

13. The method of claim 10, wherein the first layer is a silicon dioxide ($SiO_2$) precursor layer.

14. The method of claim 13, wherein the $SiO_2$ precursor layer comprises tetraethyl orthosilicate (TEOS).

15. The method of claim 10, wherein a profile of the one or more first openings is unchanged by the forming of the one or more final openings.

16. The method of claim 10, further comprising, after the forming of the first plugs and before the forming of the final openings:
    forming one or more second openings in the first layer, the second openings exposing the top surface of the second layer, the one or more first openings in the first layer and the opening profile being protected by the one or more first plugs; and
    selectively growing the Group VIII metal on the exposed top surface of the second layer within the second openings of the first layer, thereby forming one or more second plugs.

17. The method of claim 16, wherein the first and second openings are line trenches and the forming of the first and second line trenches comprises:
    forming an over-layer stack on the first layer, the over-layer stack comprising a resist layer having one or more resist openings;
    forming line trenches through the first layer at the one or more resist openings such that the top surface of the second layer is exposed; and
    removing the over-layer stack.

18. The method of claim 16, wherein a profile of the one or more first openings is unchanged by the forming of the one or more second openings and the one or more final openings, and a profile of the one or more second openings is unchanged by the forming of the one or more final openings.

19. A method of protecting an opening profile of an integrated circuit from rework, the method comprising:
    forming a first layer on a second layer, the first or second layer being a titanium nitride (TiN) layer;
    forming an over-layer stack on the first layer, the over-layer stack comprising a resist layer having one or more resist openings;
    forming one or more first openings through the first layer at the one or more resist openings, the one or more first openings defining the opening profile of the integrated circuit, and exposing the top surface of the second layer;
    removing at least a portion of the over-layer stack;
    selectively growing cobalt (Co) or ruthenium (Ru) within the one or more first openings, thereby forming one or more first plugs;
    removing any remaining portion of the over-layer stack;
    forming one or more final openings in the first layer in the first layer while the one or more first openings in the first layer are protected by the one or more first plugs; and
    removing the one or more first plugs.

20. The method of claim 19, wherein the second layer is formed over an under-layer stack, the under-layer stack comprising one or more layers of the integrated circuit, one or more stacks of layers of the integrated circuit, or a combination thereof.

* * * * *